United States Patent
Jiang et al.

(10) Patent No.: US 11,056,409 B2
(45) Date of Patent: Jul. 6, 2021

(54) COMPOSITE MATERIAL AND A SEMICONDUCTOR CONTAINER MADE OF THE SAME

(71) Applicant: GUDENG PRECISION INDUSTRIAL CO., LTD., New Taipei (TW)

(72) Inventors: Jyun-Yan Jiang, New Taipei (TW); Ming-Chien Chiu, New Taipei (TW)

(73) Assignee: GUDENG PRECISION INDUSTRIAL CO., LTD., New Taipei (TW)

(*) Notice: Subject to any disclaimer, the term of this patent is extended or adjusted under 35 U.S.C. 154(b) by 0 days.

(21) Appl. No.: 16/777,853

(22) Filed: Jan. 30, 2020

(65) Prior Publication Data
US 2020/0243407 A1    Jul. 30, 2020

(30) Foreign Application Priority Data
Jan. 30, 2019    (TW) ................. 10810364.8

(51) Int. Cl.
*H01L 23/06* (2006.01)
*C08L 53/00* (2006.01)
*G03F 1/66* (2012.01)
*C08K 3/04* (2006.01)

(52) U.S. Cl.
CPC .............. *H01L 23/06* (2013.01); *C08K 3/042* (2017.05); *C08L 53/005* (2013.01); *G03F 1/66* (2013.01); *C08K 2201/011* (2013.01); *C08L 2203/20* (2013.01)

(58) Field of Classification Search
CPC .......... H01L 23/06; C08L 53/005; G03F 1/66
USPC ....................................................... 257/729
See application file for complete search history.

(56) References Cited

U.S. PATENT DOCUMENTS

| 10,317,406 B2* | 6/2019 | Yoon ................... G01N 33/543 |
| 2010/0147188 A1* | 6/2010 | Mamak ................. B82Y 30/00 |
| | | 106/31.13 |
| 2020/0282378 A1* | 9/2020 | Cong ................. B01J 20/28059 |

FOREIGN PATENT DOCUMENTS

| JP | 2013-157374 A | 8/2013 |
| KR | 10-2012-0121409 A | 11/2012 |
| TW | 201607606 A | 3/2016 |
| TW | I560798 B | 12/2016 |

* cited by examiner

*Primary Examiner* — Luan C Thai
(74) *Attorney, Agent, or Firm* — Cheng-Ju Chiang

(57) ABSTRACT

The present invention provides a semiconductor container which is made of composite material. The composite material is selected from a group consisting of a graphene material doped cycloolefin copolymer (COC), a graphene material doped cycloolefin polymer (COP) and a graphene material doped cyclic block copolymer (CBC). The content of the graphene material ranges from 0.6% to 8.0% by weight in each composite material.

15 Claims, 1 Drawing Sheet

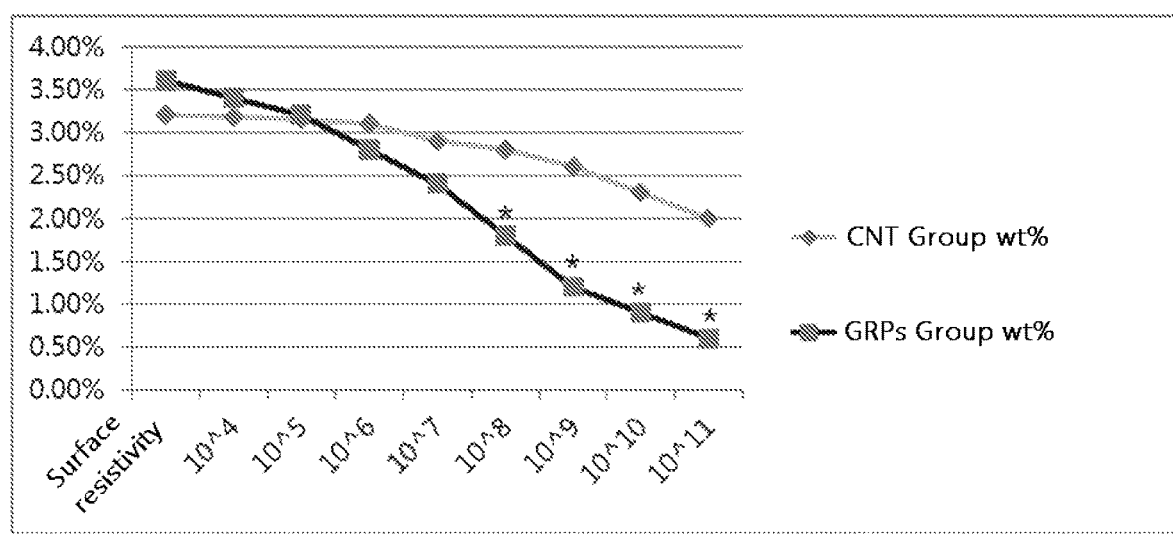

COMPOSITE MATERIAL AND A SEMICONDUCTOR CONTAINER MADE OF THE SAME

TECHNICAL FIELD

The present invention relates to a composite material and the use thereof. In particular, this invention indicates a graphene material doped composite material.

BACKGROUND OF RELATED ARTS

In semiconductor industry, containers which is commonly used for transferring include two types, the carrier and pod. The common container materials in said industry include polypropylene (PP), polycarbonate (PC), liquid crystal polymer (LCP) thereof.

Traditional containers used polypropylene as the main material. However, due to the low manufacturing yield, said material is now rarely used. Thus the containers made of polycarbonate become the main material were developed, but the water absorption of said material is greater than 0.25%, resulting in the low humidity retention time is short. In other words, the manufacturing process would have a higher demand for maintaining dryness, thus to increase the manufacturing costs. In order to the reasons mentioned above, the polycarbonate is less used now. On the other hand, liquid crystal polymer as the main material which is generally considered to have the advantages of high hardness, heat distortion temperature, yield, and long humidity retention time. Unfortunately, liquid crystal polymer still has other problems, such as high material cost, weak vertical fluid direction and fragile.

Therefore, in the aspect of the strict process standards and cost considerations of the semiconductor industry, without changing the main structure of the container, the choice of the main material per se is quite important. One of the problems should be solved by the present invention is the improvements of the materials used in such industry. Light weight, high dimensional stability, impact resistance, long humidity maintenance time, low release of harmful gases, and low volatility of organic gases are the key requirements of the material which is needed to be improved.

In traditional technology, gas flowing in most semiconductor containers is achieved through the intake and outlet. With the intake and outlet of Extreme Clean Dry Air (XCDA), the previously attached particles are removed. Although it is feasible to control the gas flowing through the valve on the semiconductor container, there is still a risk that the gas cannot be completely cleaned b just by uniformly blown on the semiconductor material such as the substrate or reticle.

For the abovementioned materials, in the subsequent development and application, the invention shown in the Taiwanese Patent Grant No. TWI560798B mentions that the use of carbon nanotubes (CNT) doped cycloolefin material controls semiconductor container having anti-static status. However, carbon nanotubes (Carbon Nanotubes, CNTs) are expensive carbon materials. The addition of carbon nanotubes, although helpful in improving various characteristics, will greatly increase the cost of semiconductor containers. In addition, the use of excessive carbon nanotubes (CNTs) in semiconductor containers may also cause environmental pollution.

SUMMARY

In the light of the significant manufacturing costs increase mentioned in the prior arts, resulting in commercial difficulties and environmental pollution problems, the present invention provides a composite material which is able to greatly reduce the use and pollution problems of carbon nanotube (CNT). On the other hand, this invention can also adjust conductivity level of the composite materials, such as conductive, electro-static dissipative (ESD), or anti-static.

As the abovementioned description, the present invention discloses a composite material including a cycloolefin material or a cyclic block copolymer (CBC), which are doped with a graphene material. The weight percentage of the graphene material is 0.6%~8.0%. The cycloolefin material is selected from a group consisting of cycloolefin copolymer (COC) or a cycloolefin polymer (COP), and the graphene material comprises graphene nanoplatelets, graphene oxide or a combination thereof.

Cycloolefin material are produced in a ring-opening metathesis polymerization (ROMP) method. Said ROMP is about a thermosetting copolymer produced by reaction injection molding, and a thermoplastic copolymer in which molecular hydrogen is controlled by a hydrogenation step. The product of the abovementioned method is cycloolefin copolymer (COC). The other is to carry out the polymerization reaction in the presence of a catalyst so that the main chain retains a bicyclic fluorene structure, that is, the cycloolefin polymer (COP).

Moreover, the cyclic block copolymer (CBC) is a polymer with high transparency, cleanliness and chemical resistance. In the present invention, a cycloolefin material and a cyclic block copolymer (CBC) are further doped with 0.6% to 8.0% by weight of said graphene material.

The semiconductor container made of said composite material of the present invention has the characteristics of light weight, high dimensional stability, impact resistance, long humidity retention time, low harmful gases release, and high yield.

Embodiments of the invention are illustrated by way of example, and not by way of limitation, in the FIGURES of the accompanying drawings in which like reference numerals refer to similar elements.

BRIEF DESCRIPTION OF THE DRAWINGS

The FIGURE illustrates a relationship between carbon material doped percentage by weight and surface resistivity for GRPs group and CNT group.

DETAILED DESCRIPTION OF THE INVENTION

In order to understand the technical features and practical efficacy of the present invention and to implement it in accordance with the contents of the specification, hereinafter, preferred embodiments of the present invention will be described in detail with reference to the accompanying drawings.

The composite material mentioned in the present invention includes a cycloolefin material a cyclic block copolymer (CBC). The cyclic block copolymer (CBC) and cycloolefin material which is selected from a group consisting of cycloolefin copolymer (COC) or a cycloolefin polymer (COP)) are doped with a graphene material. The weight percentage of the graphene material is 0.6%~8.0%. The present invention further comprises a semiconductor container made of the aforementioned composite material. The semiconductor container is substrate carrier or reticle container, and the graphene material comprises graphene nanoplatelets, graphene oxide or a combination thereof.

The reticle container may be a reticle pod. The reticle pod includes a reticle storage container, a reticle transfer container (including a Standard Mechanical Interface (SMIF) pod), or an extreme ultraviolet lithography reticle pod (EUV pod). The substrate carrier can be a front opening unified pod (FOUP), a wafer box, or any other transport or storage container used to carry the substrate used in the semiconductor process. The present invention is not limited thereto.

Cycloolefin copolymer (COC), cycloolefin polymer (COP) and cyclic block copolymer polymer (CBC) are all possible to be used in this embodiment. In this embodiment, cycloolefin polymer (COP) was used as the representative test. This test will show that the adjustment of the weight percentage of the doped graphene material will result in different surface resistivity including less than $10^4$ Ω/sq., $10^5 \sim 10^9$ Ω/sq., Or $10^9 \sim 10^{12}$ Ω/sq., which are represented as conductive, Electro-Static Dissipative (ESD) or anti-static (Anti-static) level respectively.

In other words, when the surface resistivity of the composite material is less than $10^4$ Ω/sq., the composite material become conductive, thus being EMI Shielding. On the other hand, when the surface resistivity of the composite material is $10^5 \sim 10^9$ Ω/sq., the composite material become Electro-Static Dissipative (ESD), thus being ESD Protection. Finally, when the surface resistivity of the composite material is $10^9 \sim 10^{12}$ Ω/sq., the composite material will become Anti-static.

According to the abovementioned description of the present invention, various examples of different weight percentage of the graphene material and the effects of distinguishable surface resistivity of the composite material will be recited in the following embodiments.

Graphene Material Group (GRPs Group)
Reticle Pod made of cycloolefin polymer (COP) which is doped with 0.6 wt %~3.6 wt % graphene material.
Carbon NanoTube Group (CNT Group)
Reticle Pod made of cycloolefin polymer (COP) which is doped with 2.0 wt %~3.2 wt % Carbon nanotube (CNT).

Please referring to the FIGURE. The FIGURE illustrates a relationship between carbon material doped percentage by weight and surface resistivity for GRPs group and CNT group. In the embodiment of the present invention, graphene material is doped in cycloolefin polymer (COP), and the weight percentage of said graphene material is between 0.6% and 3.6%. The surface resistivity is adjusted to be $10^4$ to $10^{12}$ Ω/sq. simultaneously.

In fact, the FIGURE does not tell but the weight percentage of the graphene material that can be adjusted between 3.6% and 8.0%, thus to maintain the surface resistivity of less than $10^4$ Ω/sq., which is conductive state, for the EMI Shielding without losing the available physical characteristics per se.

In the FIGURE, the weight percentage requirement ratio of the graphene material doped in GRPs group is adjusted from the surface resistivity to $10^8$ Ω/sq., and the ratio which is compared with the CNT group, the test in the FIGURE shows a significant (*) reduction in the amount of carbon material used. That is, comparing with the GRPs group and CNT group, since the surface resistivity was adjusted to $10^8$ Ω/sq., the amount of used carbon material is decreased significantly (32%).

As shown in the FIGURE, when the weight percentage of the doped graphene material ranges from 3.6% to 8.0%, the surface resistivity per se is adjusted to less than $10^4$ Ω/sq. respectively. Thus shows a conductive composite material to obtain the effect of EMI shielding in this embodiment (GRPs Group).

When the weight percentage of the doped graphene material ranges from 1.8% to 3.6%, the surface resistivity per se is adjusted between $10^5$ and $10^9$ Ω/sq. respectively. It shows Electro-Static Dissipative (ESD) and be ESD Protected in this embodiment (GRPs Group).

Finally, when the weight percentage of the doped graphene material ranges from 0.6% to 1.8%, the surface resistivity per se is adjusted from $10^9$ to $10^{12}$ Ω/sq. respectively. The composite material become Anti-static in this embodiment (GRPs Group).

Comparing with the CNT group and GRPs Group in Anti-static zone, the amount of carbon material used in this embodiment (GRPs Group) decreases more significantly than the CNT group. The decreased amount percentage ranges from 35.7%~70%.

Otherwise, please see the table 1 as follows:

TABLE 1

| | weight percentage of the doped carbon material & surface resistivity | |
|---|---|---|
| Group | CNT Group | GRPs Group |
| Composition | Cycloolefin polymer (COP) + 2.0 wt %-2.8 wt % Carbon Nanotube (CNT) | Cycloolefin polymer (COP) + 0.6 wt %-1.8 wt % graphene material |
| Surface Resistivity (Ω/sq.) | $10^9 \sim 10^{12}$ | $10^9 \sim 10^{12}$ |
| Anti-static | True | True |

When the reticle pod made of cycloolefin polymer (COP) is doped with 0.6% to 1.8% by weight of graphene material, the surface resistivity is between $10^9$ and $10^{12}$ Ω/sq., reaching the Anti-static level. Under the same conditions, the reticle pod made of cycloolefin polymer (COP) needs to doped with 2.0% to 2.8% by weight of carbon nanotube (CNT), then to have the same surface resistivity as the GRPs Group, being anti-static level.

Hence, table 1 shows that the reticle pod made of cycloolefin polymer (COP) doped with graphene material ranges from 0.6 wt % to 1.8 wt % is more advantageous than the carbon nanotubes used in the CNT Group. The amount of carbon material used in CNT Group is higher than the GRPs Group over 35.7% to 70%. The results in table 1 further proves that the GRPs Group of the present invention can significantly save the manufacturing cost of the semiconductor container in anti-static level.

Furthermore, the GRPs Group of the present invention further proves that the brilliant effect is still maintained under the amount of carbon material used in this GRPs Group is greatly reduced. Even the surface resistivity is less than $10^4$ Ωsq. or between $10^5$ and $10^9$ Ω/sq., the weight percentage of the doped graphene material in GRPs Group is not significantly different from the weight percentage of the doped carbon nanotube in the CNT Group. However the GRPs Group still achieves the function of replacing the carbon nanotube, even avoiding the risk of environmental pollution.

In this embodiment, the anti-harmful ion releasing ability between the reticle pod which is made of cycloolefin polymer (COP) doped with a weight percentage of 0.6% to 3.6% graphene material (GRPs Group) is nearly the same as the reticle pod which is made of cycloolefin polymer (COP) doped with carbon nanotube (CNT). The harmful ions include fluoride ion (F$^-$), chloride ion (Cl$^-$), nitrite ion (NO$_2{}^2{-}$), bromide ion (Br$^-$), nitrate ion (NO$_3{}^-$), and sulfate ion ($SO_4^{2-}$), Lithium ion ($Li^+$), ammonium ion ($NH_4^+$), potassium ion ($K^+$), magnesium ion ($Mg^{2+}$) and calcium ion ($Ca^{2+}$).

The embodiments of the present invention further test the drop height of the reticle pod made of graphene material doped cycloolefin polymer (COP) with a weight percentage of 0.6% to 3.6%. As the result, the reticle pod made of 0.6 wt % to 3.6 wt % graphene nanoplatelets doped cycloolefin polymer (COP) can achieve the same anti-collision ability without generating any damage from a height of 90 cm with the reticle pod made of 2.0 wt % to 3.2 wt % carbon nanotube doped cycloolefin polymer (COP).

In the light of semiconductor containers need to have good airtightness for avoiding contamination by external gases or particles. The moisture in the semiconductor container should be quickly eliminated in a short time. In other words, the semiconductor container maintaining at a low relative humidity for a long time means that the semiconductor container is not easily penetrated by water and air, and the airtight is relatively great. Therefore, the relative humidity test in the semiconductor container is further performed for the two Groups mentioned above. In table 2 as follows:

TABLE 2

0% relative humidity maintaining period

| Group | Composition | 0% relative humidity maintaining period (min) |
|---|---|---|
| CNT Group | Cycloolefin polymer (COP) + 2.0 wt %-2.8 wt % Carbon Nanotube (CNT) | 79.6 |
| GRPs Group | Cycloolefin polymer (COP) + 0.6 wt %-1.8 wt % graphene material | 79.8 |

In table 2, the reticle pod made of CNT Group and the reticle pod made of the CNT Group performed almost the same to have the 0% relative humidity maintaining period.

Please see the table 3 as follows:

TABLE 3

Reticle pod characteristics test

| Group | CNT Group | GRPs Group |
|---|---|---|
| Composition | Cycloolefin polymer (COP) + 2.0 wt %-2.8 wt % Carbon Nanotube (CNT) | Cycloolefin polymer (COP) + 0.6 wt %-1.8 wt % graphene material |
| Specific weight | 1.02 | 1.01 |
| Water absorbency (%) | <0.01 | <0.01 |
| Tensile Strength (MPa) | 55 | 53 |
| Flexural Strength (Mpa) | 97 | 95 |
| Tensile Elongation (%) | <5 | <5 |
| Impact Strength (J/m) | 32 | 30 |
| Shrinkage (%) | 0.2~0.5 | 0.2~0.5 |

Table 3 show the results of the reticle pod characteristics tests. In table 3, it further proves that the GRPs Group is as well as the CNT Group, however the GRPs Group significantly reduces the amount (35.7% to 70%) of expensive carbon material used in reticle pods.

Among the aforementioned reticle pod characteristics, the cycloolefin material doped with graphene material or the cyclic block copolymer (CBC) doped with graphene material have specific weight of 1 to 1.2. However, the specific weight of common liquid crystal polymer (LCP) material is about 1.5. In other words, for a semiconductor container having the same size and the cycloolefin material is used as the main material, the weight of the present invention will be reduced by 25% to 50%, being substantially and obviously helpful for the transporting operation.

In addition, the water absorbency of the cycloolefin material and the cyclic block copolymer (CBC) is between 0.0001% and 0.01% in present invention, which is a cycloolefin material with low water absorbency. That is, the present invention does not absorb moisture per se. Therefore, the semiconductor container of the present invention is applicable in a semiconductor cleaning process.

Furthermore, the Tensile Elongation (%) at break of the cycloolefin material and the cyclic block copolymer (CBC) is about 5%, which is significantly advantageous than commercial liquid crystal polymer (LCP) (the Tensile Elongation (%) of LCP semiconductor container is usually less than 1%). Thus the present invention indicates that the material used in this embodiment has better tensile elongation performance, preventing being brittle.

As shown in Table 3, the Impact Strength of this embodiment is greater than or equal to 30 (J/m) and falls between 30 (J/m) to 50 (J/m). As for the Shrinkage (%) of this embodiment, it also falls between 0.1% and 0.5%, which helps to improve the size stability and yield of the product.

The composite material used in the embodiments of the present invention and the semiconductor container to which it is applied do not limit the appearance form or size of the applicable containers. The technical features disclosed in the present invention, which are based on cycloolefin material such as Cycloolefin copolymer (COC), cycloolefin polymer, COP and cyclic block copolymer polymer (CBC), and further doped with a specific weight percentage of graphene material. That is, this invention is possible to provide a composite material which is equivalent to the expensive carbon nanotubes (CNT) doped materials having semiconductor package electromagnetic interference shielding (EMI Shielding), electrostatic protection (ESD Protection) and anti-static. This feature can significantly reduce or replace the use of expensive carbon materials (35.7%~70%), so as to achieve a significant reduction in manufacturing cost efficiency without affecting the performance per se.

As is understood by a person skilled in the art, the foregoing preferred embodiments of the present invention are illustrated of the present invention rather than limiting of the present invention. It is intended to cover various modifications and similar arrangements included within the spirit and scope of the appended claims, the scope of which should be accorded the broadest interpretation so as to encompass all such modifications and similar structure. While the preferred embodiment of the invention has been illustrated and described, it will be appreciated that various changes can be made therein without departing from the spirit and scope of the invention.

What is claimed is:

1. A semiconductor container made of composite material, comprising:

a cycloolefin material is selected from a group consisting of a graphene material doped cycloolefin copolymer (COC) and a graphene material doped cycloolefin polymer (COP);
wherein the graphene material having a weight percent range from 0.6%-8.0%;
wherein the graphene material comprises graphene nanoplatelets, graphene oxide or combination thereof;
wherein the semiconductor container made of composite material is substrate container or reticle container.

2. The semiconductor container made of composite material as claimed in claim 1, wherein the reticle container is extreme ultraviolet lithography reticle pod (EUV Pod).

3. The semiconductor container made of composite material as claimed in claim 1, wherein the semiconductor container made of composite material having a specific weight range from 1-1.2.

4. The semiconductor container made of composite material as claimed in claim 1, wherein the semiconductor container made of composite material having a water absorbency percentage ranges from 0.0001%~0.01%.

5. The semiconductor container made of composite material as claimed in claim 1, wherein the semiconductor container made of composite material having a shrinkage percentage ranges from 0.1%-0.5%.

6. The semiconductor container made of composite material as claimed in claim 1, wherein the semiconductor container made of composite material having an Impact Strength ranges from 30-50 J/m.

7. The semiconductor container made of composite material as claimed in claim 1, wherein the semiconductor container made of composite material having a surface resistivity ranges from $10^9$~$10^{12}$ Ω/sq. when the weight percent of the graphene material ranges from 0.6%-1.8%.

8. The semiconductor container made of composite material as claimed in claim 1, wherein the semiconductor container made of composite material having a surface resistivity ranges from $10^5$~$10^9$ Ω/sq. when the weight percent of the graphene material ranges from 1.8%-3.6%.

9. The semiconductor container made of composite material as claimed in claim 1, wherein the semiconductor container made of composite material having a surface resistivity which is less than $10^4$ Ω/sq. when the weight percent of the graphene material ranges from 3.6%-8.0%.

10. The semiconductor container made of composite material as claimed in claim 1, wherein the cycloolefin material is further selected from a graphene material doped cyclic block copolymer (CBC).

11. A composite material is selected from a group consisting of a graphene material doped cycloolefin copolymer (COC) and a graphene material doped cycloolefin polymer (COP);
wherein the graphene material having a weight percent range from 0.6%-8.0%;
wherein the graphene material comprises graphene nanoplatelets, graphene oxide or combination thereof.

12. The composite material as claimed in claim 11, wherein the composite material is further selected from a graphene material doped cyclic block copolymer (CBC).

13. The composite material as claimed in claim 11, wherein the composite material having a surface resistivity ranges from $10^9$~$10^2$ Ω/sq. when the weight percent of the graphene material ranges from 0.6%-1.8%.

14. The composite material as claimed in claim 11, wherein the composite material having a surface resistivity ranges from $10^5$~$10^9$ Ω/sq. when the weight percent of the graphene material ranges from 1.8%-3.6%.

15. The composite material as claimed in claim 11, wherein the composite material having a surface resistivity which is less than 104 Ω/sq. when the weight percent of the graphene material ranges from 3.6%-8.0%.

* * * * *